United States Patent
Antony Gomez et al.

(10) Patent No.: US 12,438,509 B2
(45) Date of Patent: Oct. 7, 2025

(54) EXTENDED ENERGY RANGE PARTICLE DETECTORS AND USES THEREOF

(71) Applicant: Trustees of Boston University, Boston, MA (US)

(72) Inventors: Ashley Antony Gomez, Boston, MA (US); Ronald Knepper, Andover, MA (US); Brian Walsh, Newton, MA (US)

(73) Assignee: Trustees of Boston University, Boston, MA (US)

(*) Notice: Subject to any disclaimer, the term of this patent is extended or adjusted under 35 U.S.C. 154(b) by 0 days.

(21) Appl. No.: 18/736,184

(22) Filed: Jun. 6, 2024

(65) Prior Publication Data
US 2025/0175135 A1    May 29, 2025

Related U.S. Application Data

(60) Provisional application No. 63/521,374, filed on Jun. 16, 2023.

(51) Int. Cl.
| | |
|---|---|
| *H03F 3/70* | (2006.01) |
| *G01T 1/17* | (2006.01) |
| *H03F 3/00* | (2006.01) |

(52) U.S. Cl.
CPC .............. *H03F 3/70* (2013.01); *G01T 1/17* (2013.01); *H03F 3/005* (2013.01)

(58) Field of Classification Search
CPC .............. H03F 3/005; H03F 3/70; G01T 1/17
See application file for complete search history.

(56) References Cited

U.S. PATENT DOCUMENTS

| | | | | |
|---|---|---|---|---|
| 3,921,012 A | * | 11/1975 | Marshall, III | ........... H03K 7/06 327/101 |
| 6,037,836 A | * | 3/2000 | Yoshizawa | .............. H03F 3/005 330/9 |
| 6,455,858 B1 | | 9/2002 | Patt et al. | |

(Continued)

OTHER PUBLICATIONS

Kanekal, S.G. et al., "The MERiT onboard the CeREs: A novel instrument to study energetic particles in the Earth's radiation belts", Journal of Geophysical Research Space Physics, 2019, 124, pp. 5734-5760 (Year: 2019).*

(Continued)

*Primary Examiner* — Blake C Riddick
(74) *Attorney, Agent, or Firm* — Cesari and McKenna, LLP; Steven M. Mills

(57) ABSTRACT

An energy detection system and method for measuring an external energy source. A detector is configured to detect an electric charge from the external energy source and produce a current. A charge sensitive amplifier (CSA) is configured to receive the current from the detector and produce a voltage signal. The CSA includes a first switch controlling a circuit path to a first switchable capacitor having a first capacitance and a second switch controlling a circuit path to a second switchable capacitor having a second capacitance greater than the first capacitance. When the electric charge exceeds a first threshold, the first switch closes the circuit path to the first switchable capacitor. When the electric charge exceeds a second threshold, the second switch closes the circuit path to the second switchable capacitor. The second threshold is greater than the first threshold.

19 Claims, 8 Drawing Sheets

(56) References Cited

U.S. PATENT DOCUMENTS

| | | | | |
|---|---|---|---|---|
| 6,501,409 | B1* | 12/2002 | Lynn | H03M 1/804 341/146 |
| 7,102,365 | B1* | 9/2006 | Atris | G01R 19/0023 324/709 |
| 7,268,815 | B1* | 9/2007 | Meynants | H04N 25/67 348/E5.081 |
| 7,626,524 | B2* | 12/2009 | Horie | H03M 1/1225 341/172 |
| 7,965,135 | B2* | 6/2011 | Yoshizawa | H03H 15/023 327/554 |
| 8,193,856 | B2* | 6/2012 | Gonzalez | H03F 1/42 330/109 |
| 8,260,565 | B2* | 9/2012 | De Geronimo | G01R 19/0061 702/65 |
| 9,787,291 | B1* | 10/2017 | Reindl | H03H 19/004 |
| 11,901,864 | B1* | 2/2024 | Goli | H03F 1/0272 |
| 2003/0205660 | A1* | 11/2003 | Takahashi | H10F 39/195 348/E5.079 |
| 2007/0035434 | A1* | 2/2007 | Tachibana | H03M 1/468 341/161 |
| 2010/0213353 | A1* | 8/2010 | Dierickx | G01T 1/17 250/214 R |
| 2011/0210235 | A1* | 9/2011 | Dierickx | G01T 1/17 250/214 R |
| 2011/0298644 | A1* | 12/2011 | Ohba | H03F 3/4565 341/155 |
| 2013/0256547 | A1* | 10/2013 | Soh | G01T 1/17 250/371 |
| 2015/0030132 | A1* | 1/2015 | Nashashibi | G01T 1/17 378/98 |
| 2015/0108355 | A1* | 4/2015 | Lee | G01N 23/04 250/369 |
| 2015/0378034 | A1* | 12/2015 | Dowaki | H04N 25/30 250/394 |
| 2016/0172396 | A1 | 6/2016 | Masuda | |
| 2017/0250661 | A1* | 8/2017 | Imaizumi | H03F 3/005 |
| 2018/0224564 | A1* | 8/2018 | Fu | G01T 1/247 |
| 2021/0082338 | A1* | 3/2021 | Xi | G09G 3/3233 |
| 2022/0368321 | A1* | 11/2022 | Wu | H03F 3/005 |
| 2024/0036218 | A1* | 2/2024 | Michel | G01T 1/17 |
| 2024/0344883 | A1* | 10/2024 | Siskos | G06V 40/1306 |

OTHER PUBLICATIONS

Capra, S. et al., "An Innovative Analog Circuit to Retrieve Energy Information From Signals of Deeply Saturated Preamplifiers Connected to Semiconductor Detectors", 2022, IEEE Transactions on Nuclear Science, 69(7), pp. 1757-1764 (Year: 2022).*

Kanekal, S. G., Blum, L., Christian, E. R., Crum, G., Desai, M., Dumonthier, J., et al. (2019). The MERiT onboard the CeREs: A novel instrument to study energetic particles in the Earth's radiation belts. Journal of Geophysical Research: Space Physics, 124, 5734-5760. https://doi. org/10.1029/2018JA026304.

G. L. Montagnani, L. Buonanno, D. Di Vita, C. Fiorini, and M. Carminati, "A Compact 4-Decade Dynamic Range Readout Module for Gamma Spectroscopy and Imaging," in 2019 IEEE International Symposium on Circuits and Systems (JSCAS), (Sapporo, Japan), pp. 1-5, IEEE, May 2019.

S. Capra, G. Secci, and A. Pullia, "An Innovative Analog Circuit to Retrieve Energy Information From Signals of Deeply Saturated Preamplifiers Connected to Semiconductor Detectors," IEEE Transactions on Nuclear Science, vol. 69, No. 7, p. 8, 2022.

X. He, A Multi-Channel Integrated Readout Circuit {MIROC) Chip for Solid State Charged Particle Detectors. PhD thesis, Boston University, 2011.

International Search Report and Written Opinion mailed Aug. 20, 2024 for International Application No. PCT/US2024/032830 filed Jun. 6, 2024 for Trustees of Boston University, 10 pages.

* cited by examiner

EXTENDED ENERGY RANGE PARTICLE DETECTORS AND USES THEREOF

CROSS REFERENCE TO RELATED APPLICATIONS

This application claims priority to and the benefit of U.S. Provisional Patent Application No. 63/521,374, filed on Jun. 16, 2023, and entitled "EXTENDED ENERGY RANGE PARTICLE DETECTORS AND USES THEREOF", the contents of which are incorporated herein by reference as though fully set forth herein.

GOVERNMENT SUPPORT

This invention was made with government support under contract 80NSSC20K1590, awarded by the NASA. The government has certain rights in this invention.

FIELD OF THE TECHNOLOGY

The subject disclosure relates to energy detection systems, and more particularly, systems capable of functioning across a wide range of energy levels and applications.

BACKGROUND OF THE TECHNOLOGY

A major limitation for radiation sensors is a confined energy range. Most radiation sensors follow a similar guiding principle—a charged particle or high energy photon strikes a detector substrate, often silicon, and liberates electrons in the detector structure. A potential is applied across the detector which sweeps the newly free electrons to a capacitor. The charge on the capacitor is proportional to the energy of the incident particle and can be measured. Depending on the application people have historically tuned the electronics. For applications focusing on very high energy incident particles, a large capacitance capacitor can be used. This will provide a high top range in energy but provide very poor energy resolution for low energy particles. In contrast, if one was interested in low energy particles, a small capacitor could be used, however it would saturate and provide no energy resolution at higher energy. Thus, there is a need for an energy detection system which can measure high and low energy sources without sacrificing resolution.

SUMMARY OF THE TECHNOLOGY

In light of the needs described above, disclosed herein is a detection system and method which utilizes an extended amplitude range chip (or ASIC) for detection of energetic particles. The chip overcomes limitations of the prior art by using a series of capacitors that get switched in to accommodate the deposited charge. The chip, as part of the systems disclosed herein, introduces a novel front-end electronical system which allows measurements of high energy particles from ~500 keV up to 3 GeV with an energy resolution of dE/of 30% and spanning multiple ion species. The front-end electronics is based on a charge-sensitive amplifier which employs switching capacitors which can dynamically increase the ability of the system to accommodate the incident energy of the particle.

The system disclosed herein increases the energy range of particles that can be measured by a sensor by using additional switching capacitors to collect the charge deposited in the solid state detector. A solid-state detector can be modeled as a reverse biased diode with some capacitance. Adding a capacitor in parallel to the detector allows the input charge to be shared by both capacitors. Voltage across a capacitor is given by the equation $V=Q/C$, where Q is the charge across the capacitor and C is the capacitance. If the capacitance increases, then for a given Q the voltage decreases. This is how the circuit can detect higher energies. As input energy increases, we add capacitors that can share the charge and bring the input signal back within the operating range of the amplifier.

In some instances, first a small capacitor is used, providing fine energy resolution with small input charge. If after receiving a particle strike, the first capacitor is close to saturation, a second larger capacitor can be switched in. If the second capacitor is becoming full, a third capacitor can be switched in. By progressively switching in larger capacitors, the chip provides accurate particle energy measurements over a wide dynamic range without losing energy resolution (dE/E).

The detection system has several direct applications. In short, the detection system enables broad-energy range, accurate radiation measurements. This application spans all communities which use radiation detectors. In the aerospace community, commercial spacecraft builders and operators regularly monitor the energetic charged particle environment impacting spacecraft with a radiation sensor. The more capable the sensor, the better protection the operator can provide. In the aeronautics community commercial airplanes regularly carry radiation monitors to measure the exposure of flight crews to radiation from space, particularly for cross-polar flights. In the scientific community, researchers seek to measure the properties of energetic particles in applications ranging from science-based spacecraft to measurements at particle accelerator facilities.

High energy radiation is also commonly used in the medical community. Radiation therapy is primarily used for cancer treatments. Detection of radiation properties enables a single radiation sensing system to characterize radiation beams and measure dose for a variety of radiation therapy applications at a range of energies. These are just some examples of fields where the subject technology is suitable for use.

BRIEF DESCRIPTION OF THE DRAWINGS

So that those having ordinary skill in the art to which the disclosed system pertains will more readily understand how to make and use the same, reference may be had to the following drawings.

DETAILED DESCRIPTION

Figure 1:
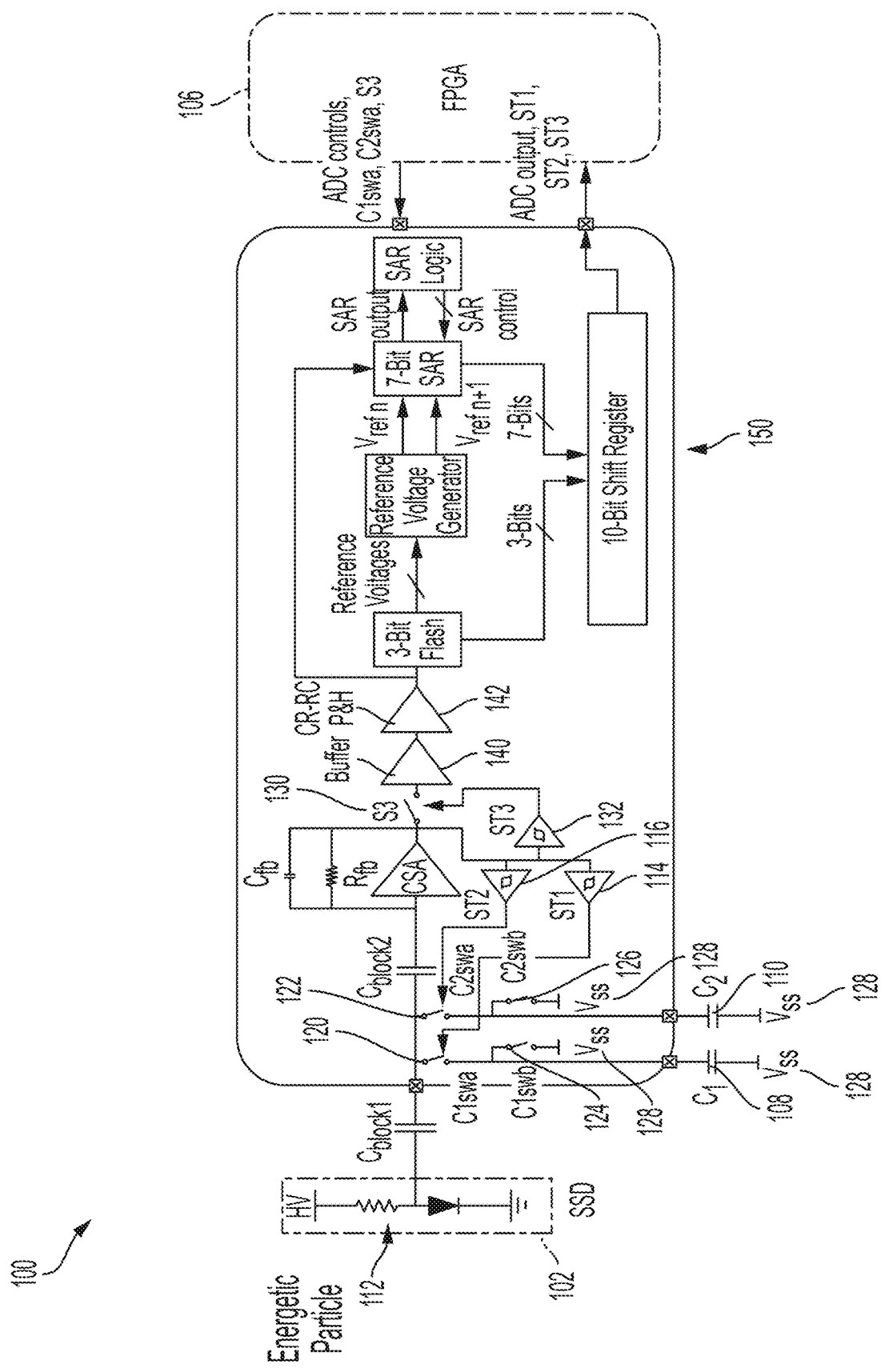
FIG. 1 is a circuit diagram of an energy detection system including a charge sensitive amplifier (CSA) in accordance with the subject technology.

The subject technology overcomes many of the prior art problems associated with the limited range of known energy detection systems. The advantages, and other features of the systems and methods disclosed herein, will become more readily apparent to those having ordinary skill in the art from the following detailed description of certain preferred embodiments taken in conjunction with the drawings which set forth representative embodiments of the present invention. Like reference numerals are used herein to denote like parts. Further, words denoting orientation such as "upper", "lower", "distal", and "proximate" are merely used to help describe the location of components with respect to one another. For example, an "upper" surface of a part is merely meant to describe a surface that is separate from the "lower" surface of that same part. No words denoting orientation are used to describe an absolute orientation (i.e. where an "upper" part must always at a higher elevation).

Referring now to FIG. 1, an exemplary system in accordance with the subject technology is shown generally at 100. The system 100 includes a detector 102 for receiving a charged particle 112 from an external energy source to be measured. In some instances, the detector can be a substrate configured to produce a current in response to a charged particle 112 from the external energy source. The charge is provided to a charge sensitive amplifier 104 (CSA), which can provide an output in the form of a voltage signal to a field programmable gate array 106 (FPGA) or other processor for obtaining a charge measurement. In general, the CSA 104 uses switchable capacitors 108, 110 to increase the range of the CSA 104. The two capacitors 108, 110 are added in parallel to the detector 102 to share the charge deposited by the energetic particle 112. As a result, the input signal amplitude drops, which prevents the CSA 104 from saturating and thus extending its operating range. The drop in the input signal amplitude comes from the equation:

$$V_{in} = \frac{Q_{in}}{C_{in}} \quad (1)$$

In Equation 1, $V_{in}$ is the amplitude of the input signal, $Q_{in}$ is the input charge and $C_{in}$ is total input capacitance and is the sum of the capacitors 108, 110, and the detector 102, which includes a capacitor and also has a capacitance. Increasing the input capacitance will decrease the input signal amplitude and ensure that the input is within the active region of the amplifier. In the example given, without any capacitors added in, the CSA 104 would reach its saturation at an input energy of about 100 MeV. All inputs higher than a 100 MeV would be indistinguishable. When the first capacitor 108 is added, the CSA 104 saturated at 1 GeV and when the second capacitor 110 is added the CSA 104 saturates at 10 GeV. It should be understood that these values are exemplary only, and in other embodiments, capacitors could be added in at different energy levels. Further, three or more capacitors may be added in in other embodiments, depending on the desired application and energy range.

Figure 2:
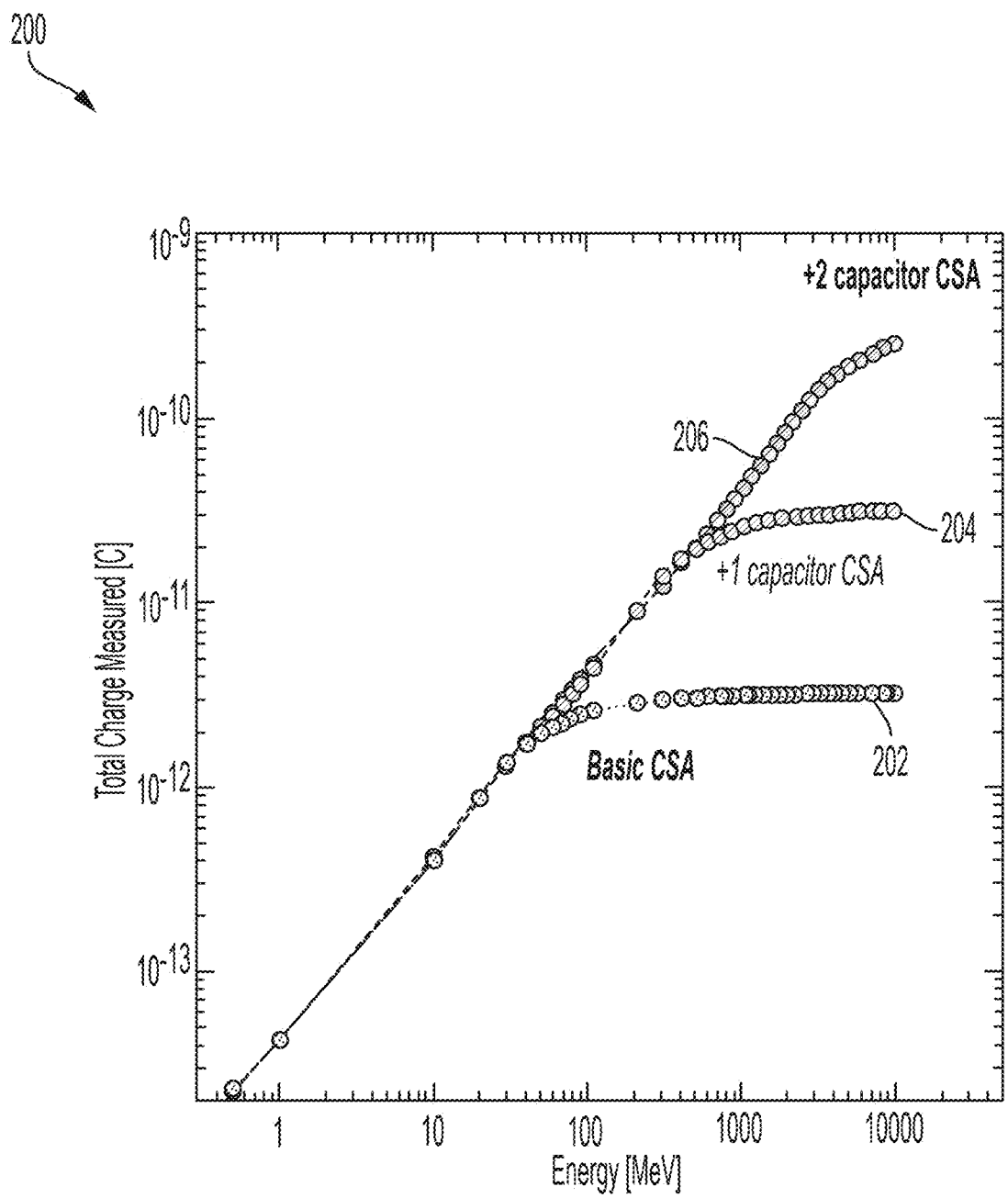
FIG. 2 is a graph of the output charge measured of the system of FIG. 1 for different input energies.

Referring now to FIG. 2, a plot 200 of charge measured at the output of the CSA versus input energy is shown in three different examples, represented by graph lines 202, 204, and 206. Graph line 202 represents an example where energy is detected without the addition of either switchable capacitor 108, 110. Graph line 204 represents an example where the energy level exceeds a first threshold, causing the first capacitor 108 to be added in. Graph line 206 represents an example where the energy level exceeds a second threshold, causing the second capacitor 110 to be added in.

Thus, referring again to FIG. 1, the output of the CSA 104 is used to decide when the capacitors 108, 110 should be added. A pair of comparators 114, 116 (each with a hysteresis) compare the output of the CSA 104 to an external reference voltage. When a 20 MeV particle deposits its charge in the detector 102, the comparator 114 produces a pulse that closes a first switch 120, adding in capacitor 108 in parallel to the detector 102 to share the deposited charge. A complementary signal is used to open the switch 124 that disconnects the capacitor 108 from voltage negative voltage supply 128 (Vss). Once the ADC 150 has completed the conversion of the peak amplitude into digital bits, the switch 120 is opened and switch 124 is closed to disconnect the capacitor 108 from the circuit and connect it to Vss 128. This is done to discharge all the charge in the capacitor before the next input. The same process is followed for capacitor 110 which is added when a 200 MeV particle is detected, using switches 122 and 126, respectively. Thus, the system 100 can have three modes of operation: mode one when no capacitors are switched in; mode two when the capacitor 108 is switched in; and mode three when both capacitors 108, 110 are switched in.

While examples of threshold charge values are given herein, it should be understood that these values could be modified for different expected applications. For example, in some instances, the threshold for the electric charge threshold for the third operation mode can be at least five times greater than the electric charge for the second threshold. In other instances, the electric charge for the second threshold is substantially (e.g. +/−10 percent) ten times greater than the electric charge for the first threshold. In some instances, the first threshold is substantially 20 MeV and the second threshold is substantially 200 MeV. Again, these values are exemplary of some preferred embodiments only, and could be adjusted for other applications, such as in High Energy Physics (HEP) experiments.

Figure 3A:
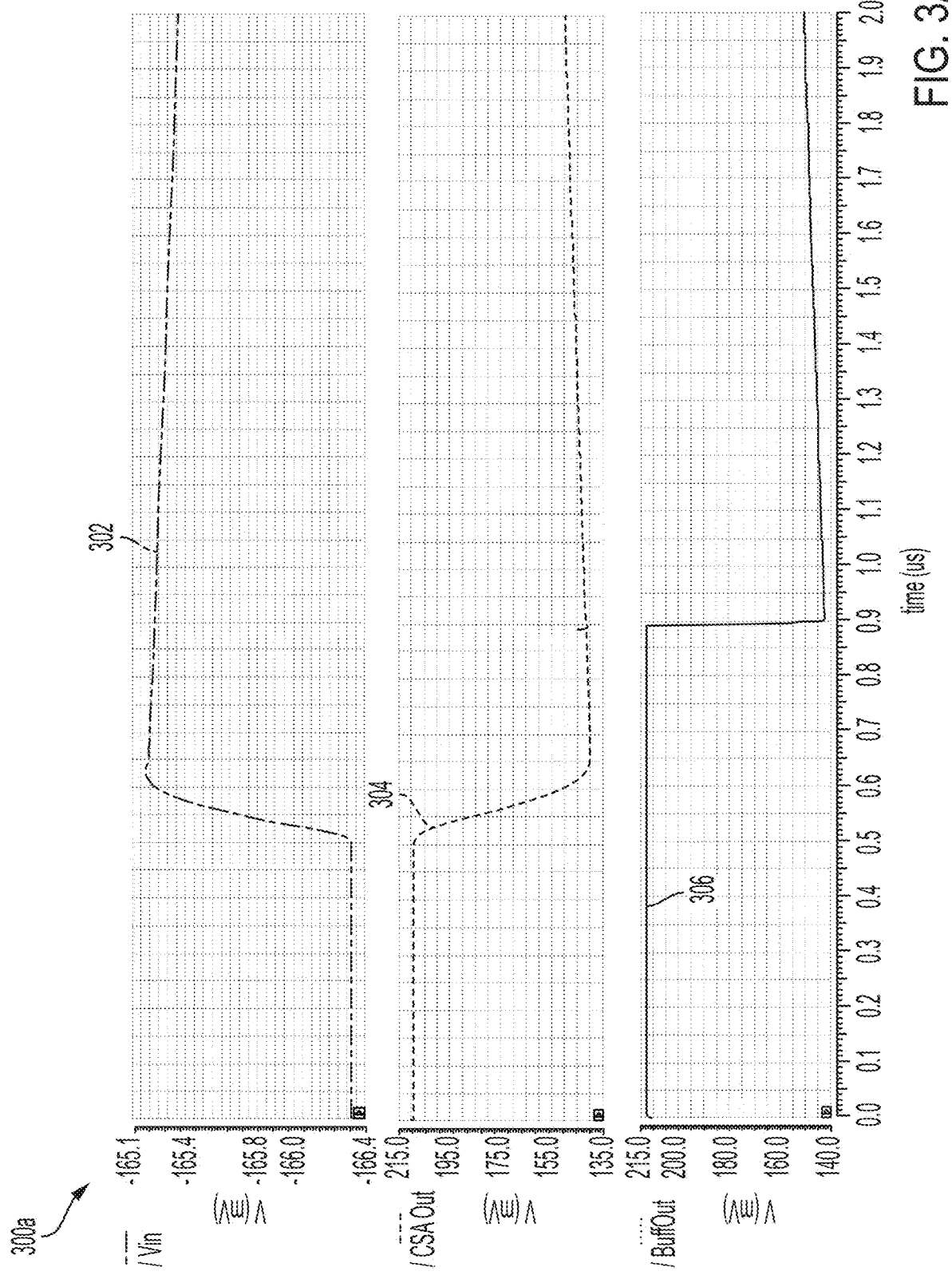
FIG. 3a is a graph of output voltage of the system of FIG. 1 while operating in a first operating mode.
Figure 3B:
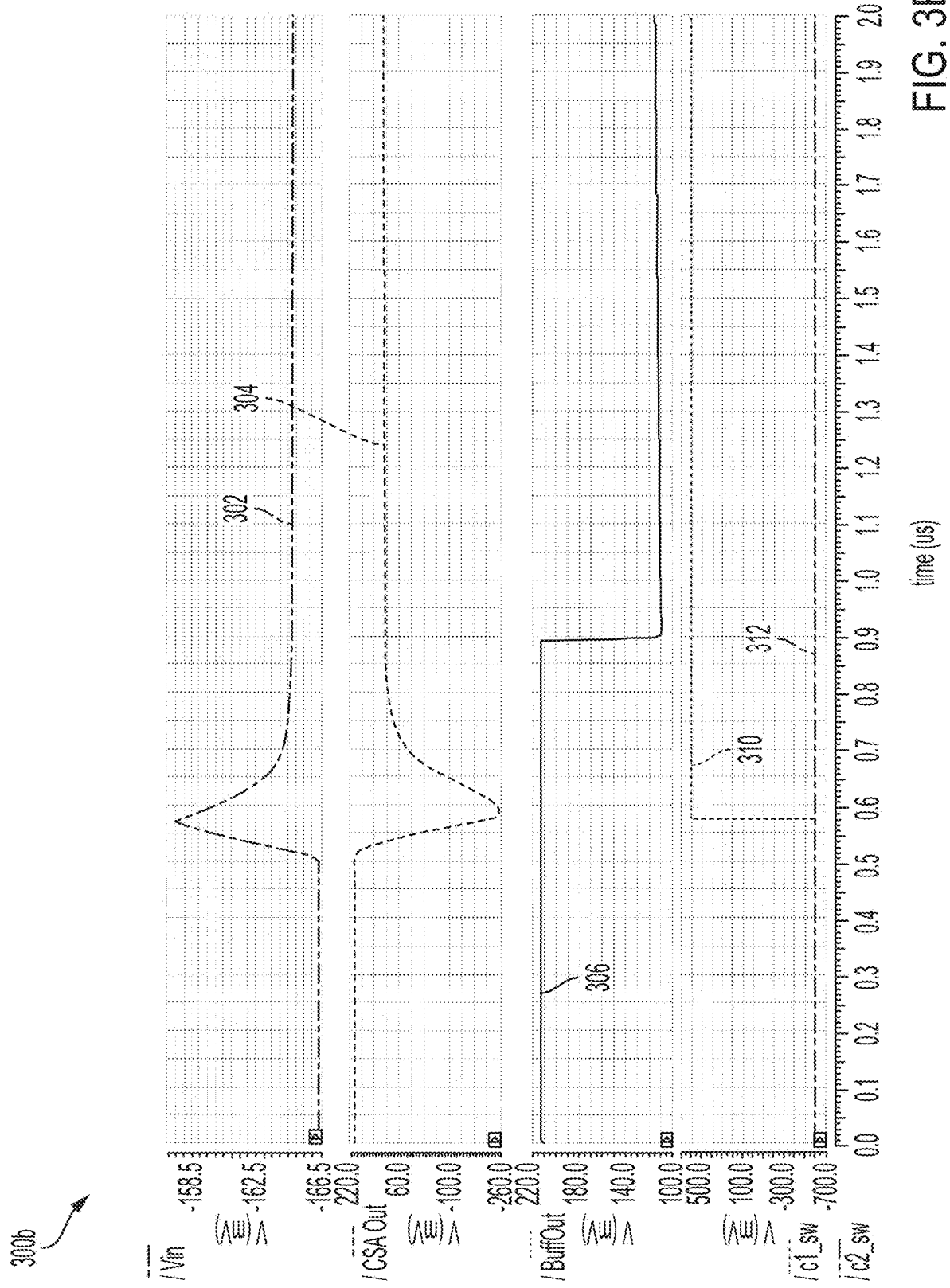
FIG. 3b is a graph of output voltage of the system of FIG. 1 while operating in a second operating mode.
Figure 3C:
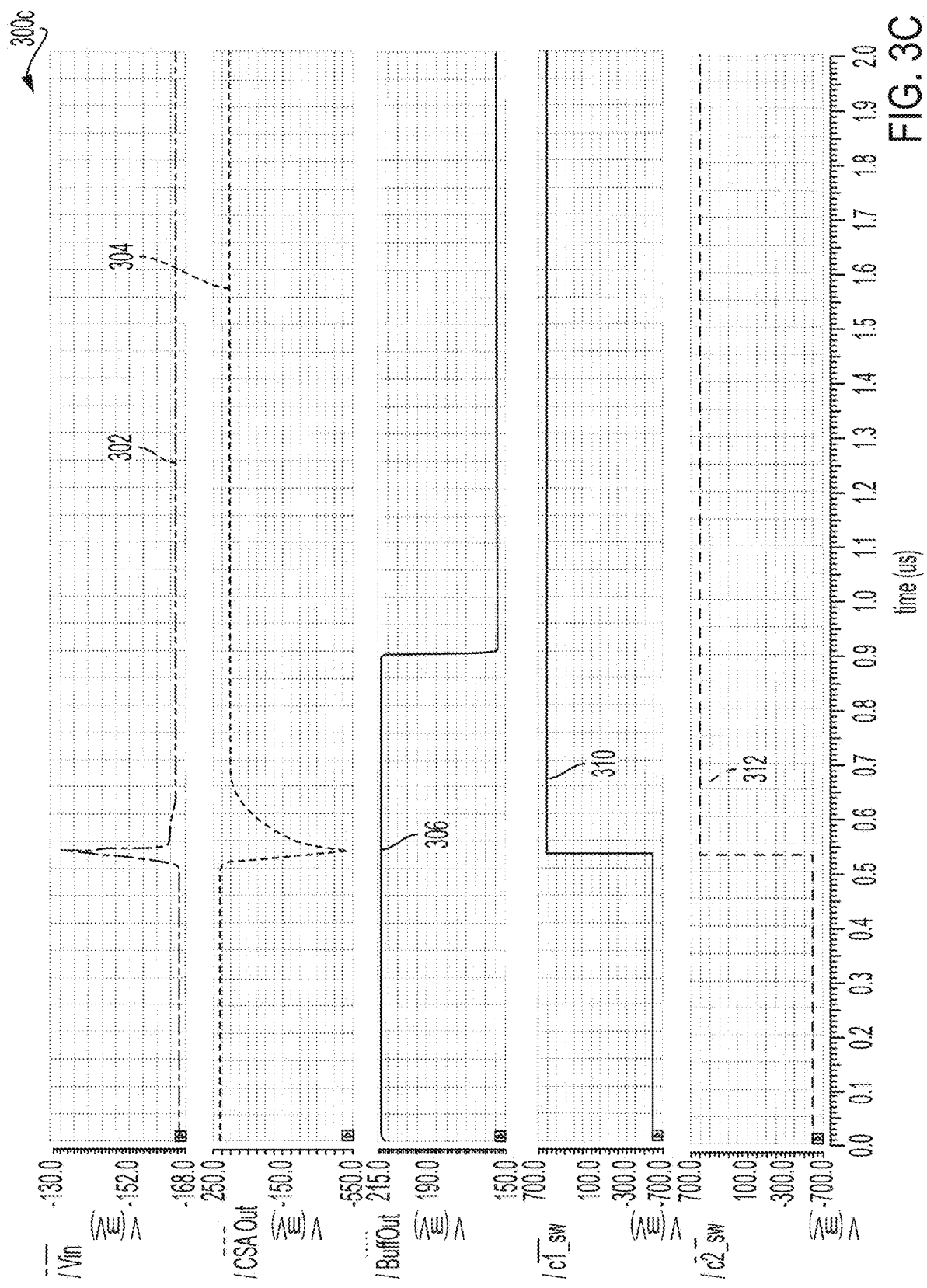
FIG. 3c is a graph of output voltage of the system of FIG. 1 while operating in a second operating mode.

Referring now to FIGS. 3a-3c, plots 300a-300c are shown, depicting the various modes of operation. In particular, plot 300a shows an input energy of 5 MeV, with the CSA 104 operating in a first mode with no capacitors added. Plot 300b shows an input energy of 50 MeV, with the CSA 104 operating in a second operating mode with the first capacitor 108 added in. Plot 300c shows an input energy of 500 MeV, with the CSA 104 operating in a third operating mode with the second capacitor 110 added in. Graph line 302 represents the input voltage generated by a particle on striking the detector 102. Graph line 304 is the output of the CSA 104, and graph line 306 is the output of the buffer 140 after the series switch 130. Graph line 310 is the signal controlling the switch 120 and graph line 312 is the signal controlling switch 122.

Referring again to FIG. 1, the addition of the capacitors 108, 110 abruptly changes the output of the CSA 104 causing a sudden drop in the peak amplitude. In order to send the correct peak amplitude to the shaping amplifiers and the ADC 150, a series switch 130 is used. The switch 130 is normally open. After the capacitors 108, 110 charge up, the switch 130 is closed. This switch 130 is controlled by a comparator 132 (ST3) and the off-chip FPGA 106. The comparator ST3 132 detects energetic particles above 500 keV, and the output is sent to an FPGA 106, which then produces a pulse to control the series switch 132. Further processing, including measuring and outputting of a final measured value, can also be performed by the FPGA 106 or other external processing unit.

Figure 4:
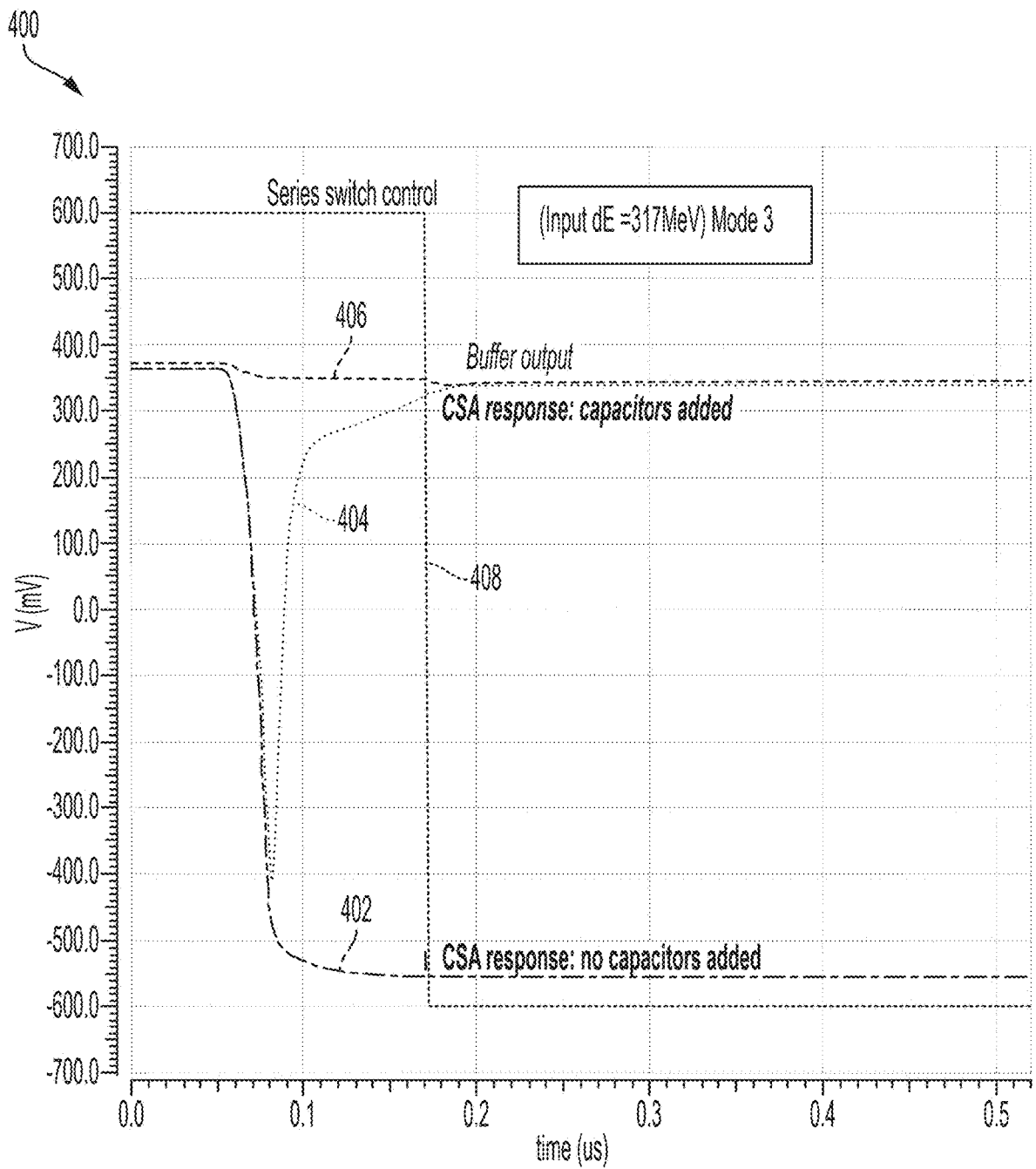
FIG. 4 is a graph showing the operation of the series switch controls for the system of FIG. 1.

Referring now to FIG. 4, an exemplary graph 400 reflects the working of the series switch 132 for a 317 MeV input. The output of the CSA 104 without any capacitors added is shown by graph line 402. Without any capacitors, the output of the CSA 104 is saturated and cannot be used to determine the exact energy of the incident particle. The output of the CSA after the capacitors are added is shown by graph line 404. The graph line 404 shows a drop in the signal amplitude. The series switch control 408 is then held open until the CSA 104 reaches the correct amplitude. The buffer amplifier 140 placed after the series switch 130 has the correct amplitude (graph line 406) and can be used to calculate the input energy.

Referring again to FIG. 1, the output of the series switch 130 is sent to a differentiator and an integrator for shaping. A peak and hold circuit 142 samples the amplitude of the integrator amplifier's output and sends it to the analog to digital convertor 150 (ADC). The output of the ADC 150 is proportional to the charge deposited by an energetic particle, it can be computed using the equation below:

$$Q_{in}(C) = \frac{ADC \text{ Voltage } (V) \times C_{input}(F)}{\text{Total Analog Gain}} \quad (2)$$

In Equation 2, Qin is the charge deposited by the energetic particles, ADC Voltage is obtained by converting the 10 bit digital output into analog voltage, and Cinput is the total capacitance at the input and total analog gain is the gain of the analog channel. One can then compute the energy deposited by the incident particle in the detector 102 (dE) from Qin from the formula below:

$$dE(MeV) = Q_{in} \times 3.62 \times 6.28 \times 10^{18} \quad (3)$$

In Equation 3, 3.62 eV is the ionization energy of Silicon and $6.28 \times 10^{18}$ is the number of electrons in 1 Coulomb of charge. Once the ADC 150 has finished conversion, a reset signal is sent from the FPGA 106 to reset the comparators, the peak and hold circuit, and to discharge the capacitors 108, 110.

Figure 5:
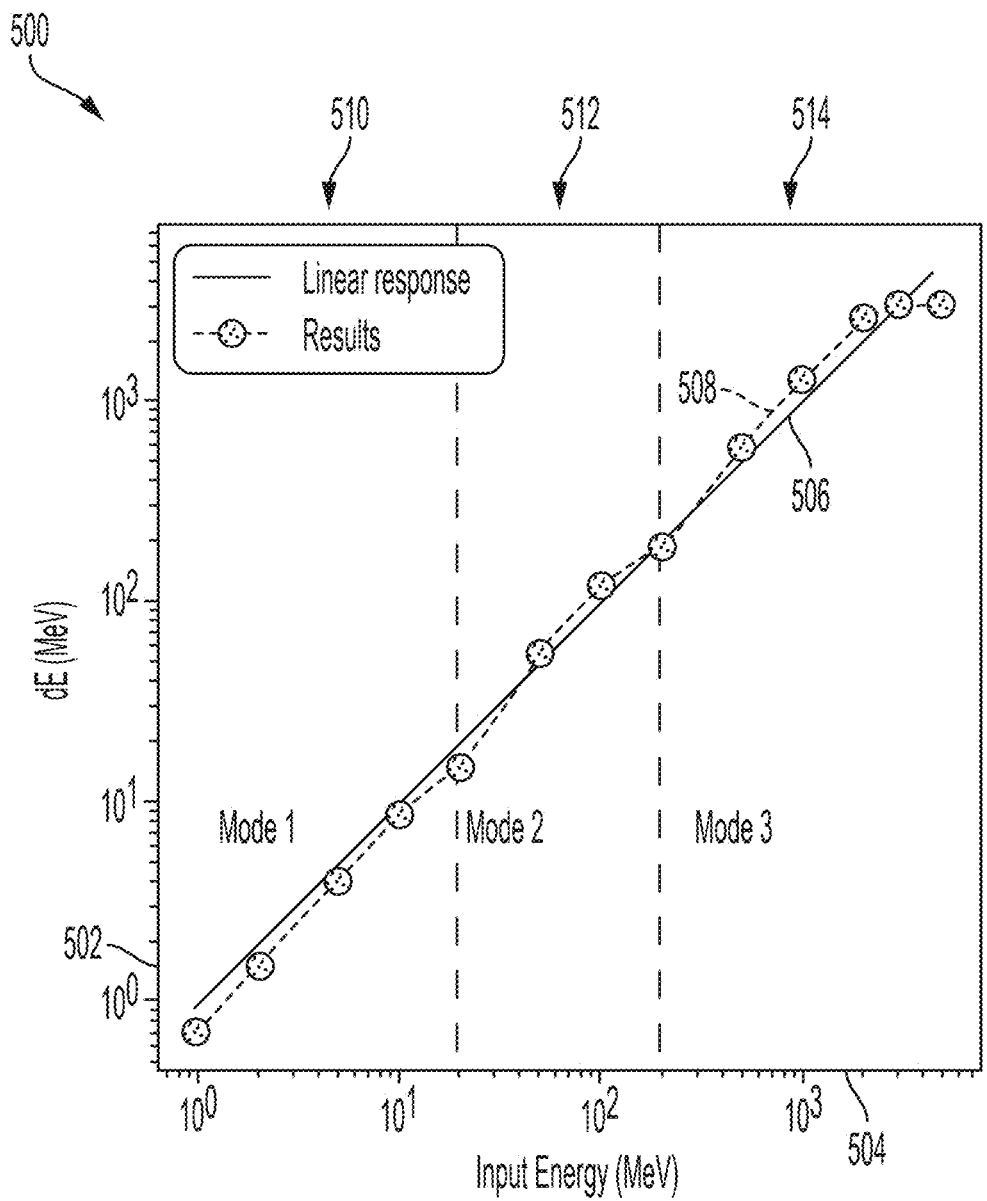
FIG. 5 is a graph of measured energy versus input energy for the system of FIG. 1.

Referring now to FIG. 5, a plot 500 of dE measured from the output of the CSA 104 (y-axis 502) versus input energy (x-axis 504) is shown. Graph line 506 shows a linear response while graph line 508 represents the actual results from the system output. A number of graph regions 510, 512, 514 show different energy levels with different numbers of capacitors added in. In particular, graph region 510 shows the measured voltage output at energy levels where no capacitors have been added in. Graph region 512 shows the measured voltage when the first capacitor 108 has been added in, while graph region 514 shows the measured voltage when the second capacitor 110 has been added in. In this example, the capacitors 108, 110 were able to extend the range of the CSA 104 to about 5 GeV.

Figure 6:
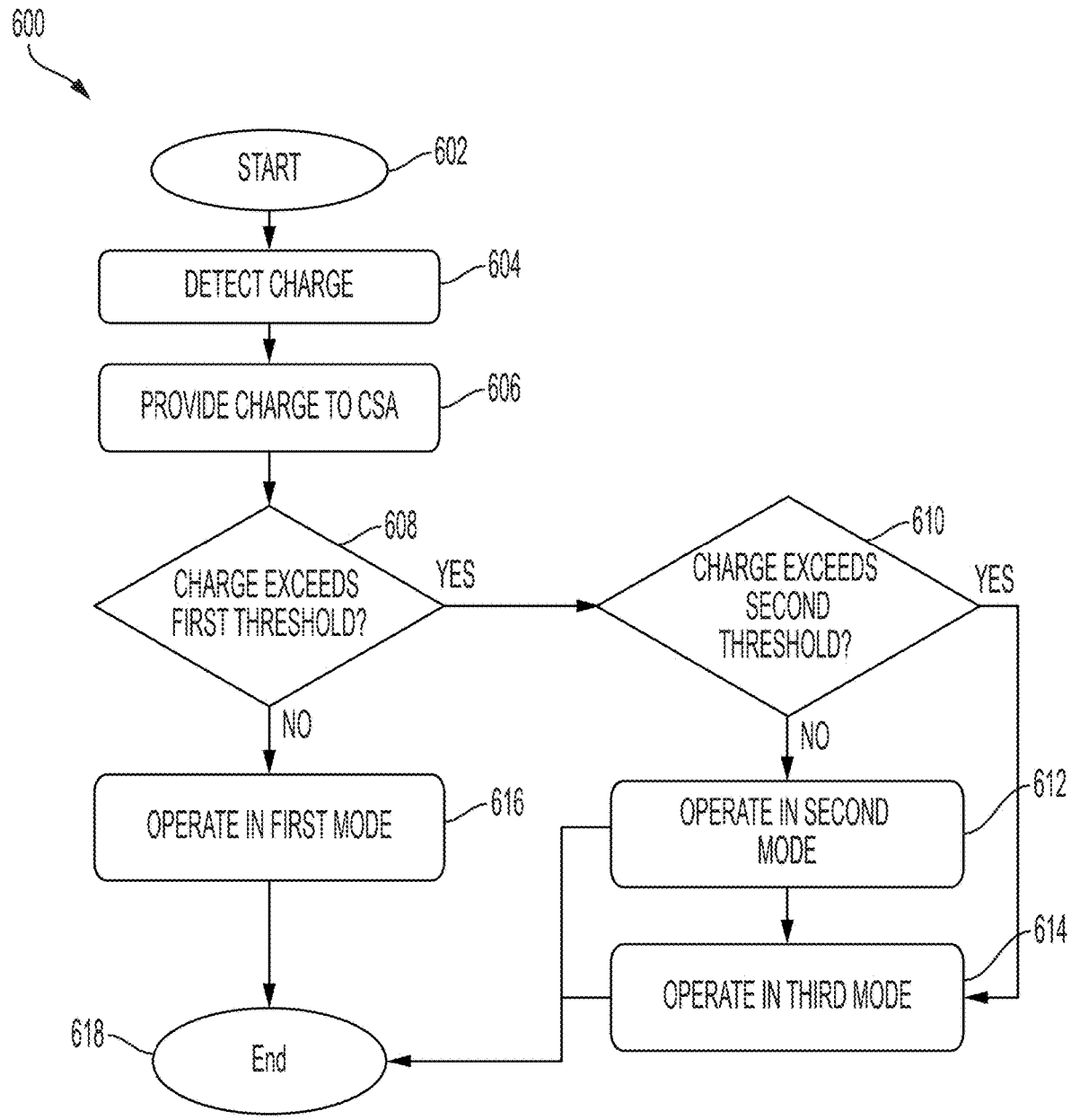
FIG. 6 is a flowchart of an exemplary method of measuring energy from an external energy source in accordance with the subject technology.

Referring now to FIG. 6, a flowchart 600 of an exemplary method of measuring energy from an external energy source in accordance with the subject technology is shown. The method can be carried out using the system 100, or using a different system similarly configured to perform the functions described herein.

The method starts at 602, with the system ready to detect energy from an external source. At step 604, an electric charge is detected from the external source. The electric charge is then provided to a CSA, at step 606. This can be accomplished, for example, by converting the charge to a current at the detector and providing the current to the CSA. The CSA includes at least two switchable capacitors, including a first switchable capacitor having a first capacitance and a second switchable capacitor having a second capacitance, where the second capacitance is greater than the first capacitance.

The CSA can operate in different modes, with different capacitors switched in, depending on the charge received. At 608, it is determined whether the charge received exceeds a first threshold. If the first threshold is not exceeded, then at step 616 the CSA can operate in a first mode where no capacitors from the CSA are added in. The charge can then be measured using the only the detector. If the charge does exceed the first threshold, the method proceeds to step 610 where the system determines whether the charge exceeds a second threshold.

If the charge does not exceed the second threshold, the system can operate in a second mode, at step 612, where a first switchable capacitor of the CSA is switched into operation to receive charge. If the charge exceeds the second threshold, then at step 614 the system can operate in a third mode where both the first and second switchable capacitors are switched into operation to receive charge. The charge can then be measured using the capacitors, as discussed herein. The method then ends at step 618, with the detected charge having been measured.

The system and methods described herein can be used in a number of different applications, as would be understood by those of skill in the art. In some instances, the technology can be used to improve imaging capabilities. Solid state pixel detectors are widely used in x-ray imaging for a number of fields. The technology described herein can be coupled with pixel detectors to serve as an improved method of signal readout. With the extended amplitude range front end electronics coupled with a pixel array of detectors, one can provide extremely high energy resolution with spatial sensing and imaging.

Further, the characteristics of the technology are easily modified to tune to specific applications. More specifically, the gain and the value of the switchable capacitors determine the range of energies the chip can measure. Changing the value of the capacitors can change the range of energies the chip can operate in. This feature makes it easy to pair the chip disclosed herein with a variety of solid-state particle detectors.

The technology is also easily scalable. Instead of using two switching capacitors, one could choose a larger number of capacitors to extend the detectable energy range further for the needs of certain applications.

All references cited herein are incorporated by reference, as though fully set forth herein. All orientations and arrangements of the components shown herein are used by way of example only. Further, it will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology.

For example, each claim may depend from any or all claims in a multiple dependent manner even though such has not been originally claimed.

What is claimed is:

1. An energy detection system for measuring an external energy source comprising:
   a detector configured to detect an electric charge from the external energy source and produce a current;
   a charge sensitive amplifier (CSA) configured to receive the current from the detector and produce a voltage signal, the CSA including: a first switch controlling a circuit path to a first switchable capacitor having a first capacitance; and a second switch controlling a circuit path to a second switchable capacitor having a second capacitance, the second capacitance greater than the first capacitance,
   wherein:
   the first switch is configured such that when the electric charge exceeds a first threshold, the first switch closes the circuit path to the first switchable capacitor; and
   the second switch is configured such that when the electric charge exceeds a second threshold, the second switch closes the circuit path to the second switchable capacitor, wherein the second threshold is greater than the first threshold.

2. The system of claim 1, further comprising a third switch controlling a circuit path in series between the CSA and a plurality of additional circuit components, including: a buffer; shaping amplifiers; a peak and hold amplifier; and an analog to digital converter (ADC).

3. The system of claim 2, wherein the third switch is configured to open after the detector receives the electric charge to allow the first switchable capacitor and the second switchable capacitor to charge before closing; and
   when the third switch is closed, the peak and hold amplifier samples the voltage signal from the CSA and provides an output signal to the ADC.

4. The system of claim 1 wherein the first switchable capacitor is in parallel to the detector and the second switchable capacitor is in parallel to the detector.

5. The system of claim 1, wherein the CSA further comprises a third switch controlling a circuit path to a third switchable capacitor,
   wherein:
   the third switch is configured such that when the electric charge exceeds a third threshold, the third switch closes the circuit path to the third switchable capacitor;
   the third threshold is greater than the second threshold; and
   the third capacitance is greater than the second capacitance.

6. The system of claim 1, wherein:
   the first capacitance is greater than five times a capacitance of the detector; and
   the second capacitance is greater than ten times the first capacitance.

7. The system of claim 1, wherein electric charge for the second threshold is at least five times greater than the electric charge for the first threshold.

8. The system of claim 1, wherein electric charge for the second threshold is substantially ten times greater than the electric charge for the first threshold.

9. The system of claim 1, wherein:
   the first threshold is substantially 20 MeV; and
   the second threshold is substantially 200 MeV.

10. A method of measuring energy from an external energy source, comprising:
    detecting an electric charge from the external energy source;
    providing the electric charge to a charge sensitive amplifier (CSA), the CSA including a first switchable capacitor having a first capacitance, and a second switchable capacitor having a second capacitance, wherein the second capacitance is greater than the first capacitance;
    operating the CSA in a first mode wherein neither of the first or second switchable capacitors are switched into operation;
    when the electric charge exceeds a first threshold, operating the CSA in a second mode, wherein the first switchable capacitor is switched into operation; and
    when the electric charge exceeds a second threshold, operating the CSA in a third mode, wherein the first and second switchable capacitors are switched into operation.

11. The method of claim 10, further comprising measuring the electric charge using any capacitors switched in.

12. The method of claim 10, further comprising operating a third switch to control a circuit path in series between the CSA and a plurality of additional circuit components, including: a buffer; shaping amplifiers; a peak and hold amplifier; and an analog to digital converter (ADC).

13. The method of claim 12, wherein the third switch is operated to open after the detector receives the electric charge to allow the first switchable capacitor and the second switchable capacitor to charge before closing, and wherein when the third switch is closed, the method further comprises operating the peak and hold amplifier to sample a voltage signal from the CSA and provides an output signal to the ADC.

14. The method of claim 10, wherein the first switchable capacitor is in parallel to the detector and the second switchable capacitor is in parallel to the detector.

15. The method of claim 10, wherein the CSA further comprises a third switch controlling a circuit path to a third switchable capacitor, wherein the method further comprises:
    when the electric charge exceeds a third threshold, closing the third switch to operate the CSA in a third mode where the first switchable capacitor, the second switchable capacitor, and the third switchable capacitor are switched into operation, wherein:
    the third threshold is greater than the second threshold; and
    the third capacitance is greater than the second capacitance.

16. The method of claim 10, wherein:
    the first capacitance is greater than five times a capacitance of the detector; and
    the second capacitance is greater than ten times the first capacitance.

17. The method of claim 10, wherein electric charge for the second threshold is at least five times greater than the electric charge for the first threshold.

18. The method of claim 10, wherein electric charge for the second threshold is substantially ten times greater than the electric charge for the first threshold.

19. The method of claim 10, wherein:
    the first threshold is substantially 20 MeV; and
    the second threshold is substantially 200 MeV.

* * * * *